United States Patent [19]

Bouchez et al.

[11] Patent Number: 5,424,962

[45] Date of Patent: Jun. 13, 1995

[54] METHOD AND SYSTEM FOR PROJECTING STEADY STATE CONDITIONS OF A PRODUCT FROM TRANSIENT MONOTONIC OR CYCLIC DATA

[75] Inventors: Jean-Pierre Bouchez, Cranbury, N.J.; Jeffrey A. Robinson, Mountain View, Calif.

[73] Assignees: Comsat, Bethesda, Md.; Intelsat, Washington, D.C.

[21] Appl. No.: 174,928

[22] Filed: Dec. 29, 1993

[51] Int. Cl.[6] .......................................... G06F 15/20
[52] U.S. Cl. .................... 364/554; 364/152; 364/153; 364/164
[58] Field of Search ................ 364/152, 153, 164, 554

[56] References Cited

U.S. PATENT DOCUMENTS

| Re. 33,055 | 9/1989 | Labbe et al. | 342/99 |
|---|---|---|---|
| 3,984,071 | 10/1976 | Fleming | 244/169 |
| 4,349,868 | 9/1982 | Brown | 364/157 |
| 4,455,612 | 6/1984 | Girgis et al. | 364/483 |
| 4,787,048 | 11/1988 | Freeman et al. | 364/466 |
| 4,816,734 | 3/1989 | Kurakake et al. | 318/615 |
| 4,818,037 | 4/1989 | McEnnan | 303/97 |
| 4,837,699 | 6/1989 | Smay et al. | 364/459 X |
| 4,884,397 | 12/1989 | LaPrad et al. | 60/39.24 |
| 5,042,752 | 8/1991 | Surauer et al. | 244/164 |
| 5,170,357 | 12/1992 | Sasaki et al. | 364/471 |
| 5,179,514 | 1/1993 | Rastegar et al. | 364/174 X |
| 5,184,292 | 2/1993 | Schneider | 364/162 |
| 5,202,620 | 4/1993 | Kawamura | 324/545 X |
| 5,210,423 | 5/1993 | Arseneau | 250/369 |
| 5,226,496 | 7/1993 | Feinland et al. | 177/25.15 |
| 5,297,064 | 3/1994 | Bauerle | 364/571.02 |
| 5,347,446 | 9/1994 | Iino et al. | 364/153 X |
| 5,351,184 | 9/1994 | Lu et al. | 364/152 X |

*Primary Examiner*—Edward R. Cosimano
*Attorney, Agent, or Firm*—Lowe, Price, LeBlanc & Becker

[57] ABSTRACT

The steady state condition of a subject product is projected using transient data developed through actual or simulated tests or operations. The transient data represent the monotonic or cyclic property states of the product while subjected to environmental or operational conditions. A first and second property state value corresponding to the transient data for selected times within the test period are identified. A first and second rate-of-change value corresponding to the change in the property states at the selected times are then computed. A time constant value is next computed by applying the time interval and the first and the second rate-of-change values to a time constant function. A projected steady state condition value is next computed by applying the second rate-of-change value, the second state value and the time constant value to a projected steady state conditions function. The projected steady state condition value is compared with a previously computed projected steady state condition value. The difference between these two steady state condition values is then compared with a threshold value to determine if a satisfactory projection of the steady state condition has been obtained. Full cycles of the property state of the product may be projected. Preferably, a closed form solution for the time constant and the projected steady state conditions function are used for the projection.

67 Claims, 6 Drawing Sheets

METHOD AND SYSTEM FOR PROJECTING STEADY STATE CONDITIONS OF A PRODUCT FROM TRANSIENT MONOTONIC OR CYCLIC DATA

BACKGROUND OF INVENTION

Field of Invention

This invention relates to steady state conditions and more particularly to a system and method for projecting the steady state conditions of a product from transient monotonic or cyclic data.

Description of Related Art

Determining the steady state condition of a product (e.g., a device or system) subjected to environmental and/or operational conditions is important in confirming compliance with specifications, shortening test time and indicating abnormal conditions which over time could become dangerous. To make such a determination, the product is typically subjected to the expected environmental and/or operational conditions during actual or simulated testing and allowed to stabilize through the natural damping process until steady state conditions are approached within an acceptable tolerance, Conventionally, for a constant set of boundary conditions the time rate-of-change of the state of the product while undergoing the testing is calculated and tracked. Once natural damping has caused the time rate-of-change to fall below some selected threshold value, the steady state condition is usually deemed to have been established. For products which require substantial time to fully respond through natural damping to changes in conditions, this conventional approach can take many hours and sometimes days before the steady state condition of the product can be determined.

Extrapolation techniques have been developed which attempt to predict the time required for a steady state condition to be reached within an acceptable tolerance through natural damping. Other techniques have been developed which attempt to speed-up the natural damping process by, for example, initially exaggerating the environmental or operational conditions to which the product is subjected in order to force the product to move more quickly towards a steady state condition.

Other extrapolation techniques attempt to project the steady state conditions of a product before the natural damping process is completed. One such technique is to curve fit the state function in order to approximate the steady state condition using an estimated time constant. However, a drawback of this technique is that a poor estimation of the time constant can result in significant error in the projected steady state condition.

Another approach is to estimate the steady state condition and to compare the estimate to the measured state of the product at selected time intervals during product testing. A correlation coefficient is then calculated. The testing continues until the correlation coefficient is maximized. Inherently, such an approach tends to be time consuming.

Thus, it is an object of the present invention to provide an improved method and system for projecting the steady state condition of a product based upon actual or simulated tests, using operational or analytical data. It is a further object of this invention to accurately project the steady state condition without the need to wait an inordinate length of time for natural damping to stabilize the product. It is a further object of the present invention to provide a method and system for accurately projecting the steady state condition of a product in less time and at less cost than required using conventional approaches. It is yet another object of the present invention to provide a method and system to project a steady state condition from a constant or cyclic set of boundary conditions resulting in monotonic or cyclic transient data.

Additional objects, advantages and novel features of the invention will become apparent to those skilled in the art from the following description as well as by practice of the invention. While the invention is described below with reference to a preferred method and system for projecting steady state conditions, it should be understood that the invention is not limited thereto. Those of ordinary skill in the art having access to the teachings herein will recognize additional applications, modifications and embodiments in other fields which are within the scope of the present invention as disclosed and claimed herein and with respect to which the present invention could be of significant utility.

SUMMARY OF THE INVENTION

The present invention provides an improved method and system for projecting the steady state condition of a product using transient data. The transient data represents the property state of a product over time, during which the product is subjected to environmental and/or operational conditions. The transient data is customarily developed through actual or simulated testing or operation of the product but may also be developed analytically.

According to the method of the present invention, two discrete times within the test or operational period, i.e., the time period for which transient data is available, are selected and the state values corresponding to the transient data for each of the selected discrete times are identified. The rate-of-change in each of these state values is computed. A time constant value is also computed by applying the time interval and the rate-of-change in the state values to a time constant function. A projected steady state condition value can now be computed by applying a state value along with the time constant value, to a projected steady state conditions function.

The projected steady state condition value can, if desired, be compared with a comparison value, which preferably is a previously projected steady state value. A threshold can be established and compared to the results of the initial comparison to determine the acceptability of the projection. Once an acceptable projection is obtained, the testing or operation of the product can be terminated.

The present invention can be used to project the steady state condition of a product whether the transient data results from a constant or cyclic set of boundary conditions, i.e., whether the transient data is monotonic or cyclic in nature. In either case, it is preferable for the later of the selected discrete times to correspond to the most current of the available transient data. For both types of data it is also preferred that the earlier of the selected discrete times be chosen such that the rate-of-change in the state of the transient data at and after that time is monotonically varying.

For monotonic data resulting from a constant set of boundary conditions, the projected steady state condition value is preferably computed using both the instantaneous rate-of-change in the state value and the state value corresponding to the later of the selected discrete times. The instantaneous rate-of-change in the state values is preferably computed using a least-squares-fit or averaging technique.

In accordance with another aspect of the invention, the time constant and projected steady state conditions functions for monotonic transient data are respectively:

$$\tau = (t_2 - t_1)/ln(y'(t_1)/y'(t_2))$$

and $$y_\infty = y(t_2) + \tau * y'(t_2)$$

where $t_1$ is the earlier of the selected discrete times;
$t_2$ is the later of the selected discrete times;
$y'(t_1)$ and $y'(t_2)$ are the computed instantaneous rate-of-change in the state values at $t_1$ and $t_2$; and
$y(t_2)$ is the identified state value at $t_2$.

For transient data which are cyclic in nature, the available transient data must exceed one cycle of data. The rate-of-change in the state value can be computed arithmetically by subtracting the state value identified for each of the selected discrete times from a corresponding state value measured at a prior time separated from the selected time by a single cycle period. Thus, the rate-of-change in the state values represents the change in the transient data over one cycle period and at the same phase location within the different cycles. Although the preferred implementations are described in terms of single cycle variations, it will be understood by those skilled in the art that the invention can be easily implemented using the principles described where the rate of change in the state values are computed over more than a single cycle period.

According to a further aspect of the invention, to ensure that the cyclic rate-of-change in the state values at the selected discrete times are monotonically decreasing, a state value set comprised of a plurality of state values corresponding to the transient data at a plurality of discrete times within more than one cycle of the transient data is identified. A rate-of-change value set corresponding to the state value set is then computed. The earlier of the selected discrete times is chosen to be a time having a state value with a corresponding rate-of-change which is monotonically varying.

In accordance with other aspects of the invention, the projected cyclic state condition value is preferably computed by applying the state value associated with the later of the selected discrete times to the projected steady state conditions function.

According to still further aspects of the invention, the time constant and projected steady state conditions functions used for cyclic transient data are respectively:

$$\tau = (t_2 - t_1)/ln(\Delta y(t_1)/\Delta y(t_2))$$

where
$t_1$ is the selected first discrete time,
$t_2$ is the selected second discrete time, and
$\Delta y(t_1)$ and $\Delta y(t_2)$ are the computed first and second rate-of-change in the state values.

$$y_\infty(\psi) = y(t) + \Delta y(t_2) * e^{(t_2-t)/\tau}/(e^{t_c/\tau} - 1)$$

where, $t$ is a discrete time within a cycle of transient data of a period $t_c$,
$y(t)$ is the state value corresponding to the transient data at the discrete time $t$ and an associated phase $\psi$ within the period, and
$t_c$ is a period of time equal to one cycle of the transient data.

According to yet other aspects of the invention, the method of projecting the cyclic steady state condition can be, and is preferably, extended to project a full cycle of state conditions. This is accomplished by identifying a state value set comprised of a plurality of state values corresponding to transient data at discrete times within the full cycle of transient data which ends at the later of the selected discrete times. Each state value within the set and the time to which it corresponds is applied to the above projected steady state conditions function. If desired, a rate-of-change value set corresponding to the state value set can be computed. A time constant value set can then be computed by applying the computed rate-of-change values to the time constant function. A projected cyclic steady state condition value set can now be computed by applying each state value within the state value set, the computed rate-of-change value corresponding to that state value and the computed time constant value associated with the applicable rate of change value to the projected steady state conditions function. It will be understood by those skilled in the art that should it be desired, the present invention could be even further extended in a similar manner to project cyclic state conditions over multiple cycles instead of the reproducible condition at steady state as described above.

The maximum and minimum projected steady state condition values within the set of projected values can be compared with comparison values, representing maximum and minimum state values of the product, to obtain comparison results. Preferably, the comparison values are previously computed projected steady state condition values of the extreme. These comparison results can be respectively compared with an established threshold to obtain a threshold comparison result. The threshold comparison result can be used in determining the acceptability of the projected cyclic steady state condition value set.

According to another aspect of the invention, a state function representing the transient data as a function of time and a change-in-state function representing changes in the transient data as a function of time are developed. A time constant function expressed in terms of at least the change-in-state function is then developed. The projected steady state conditions function expressed in terms of the state function, the change-in-state function and the time constant function is next developed.

For products having monotonic transient data, the change-in-state function may be developed by taking the first derivative of the state function. The projected steady state conditions function can be derived by integrating the change-in-state function over a time period beginning at a discrete time within the above mentioned test or operational period and ending at a discrete time corresponding to the time at which a steady state condition will be projected.

For products with cyclic transient data, the cyclic state function is developed for a period of more than one cycle of the transient data. The cyclic change-instate function is then developed to represent changes in the transient data from one cycle to another.

The system of the present invention includes a storage device, such as a local hard drive, calculator memory or any other electronic or magnetic memory device or mechanism capable of providing the necessary storage of and access to the necessary data. In the preferred embodiment, the time constant and projected steady state conditions functions are developed off-line, i.e., in non-real time, to reduce the on-line, i.e., real time, processing requirements and for transportability. However, the system of the present invention could be functionally extended to perform all computations and processing necessary to develop the functions in real time as an integral part of the system, if so desired. Thus, the time constant and projected steady state conditions functions along with comparison and threshold values are preferably stored in the memory device. The transient data could also be stored on the above described storage device but is preferably stored on a local area network (LAN) server to which the data has been transferred directly from a test device or simulator.

An input device such as a keyboard, scanner, voice recognition or other data acquisition device or mechanism to provide inputs to the system is provided to enter the selected discrete times into the system. The input device may also be used to load the time constant and projected steady state conditions functions, and, if desired, the transient data and the comparison and threshold values into the system.

A processor, which can be a personal computer, work station, calculator or other processing device retrieves the applicable state values from the stored transient data. A LAN, wide area communications network or other communications link to the LAN server could be used for this purpose. After retrieving and locally storing the required state values, including the associated times at which they occur, the processor computes, and optionally stores, the necessary rate-of-change values. The processor then retrieves the time constant function and computes the time constant value by applying the computed rate-of-change values to the function. The projected steady state conditions function is next retrieved and a projected steady state condition value is computed by application of a state value and the time constant value to the function.

A comparator may optionally be provided and used to compare the computed projected steady state condition value with a stored comparison value corresponding to an actual or projected state of the subject product. Preferably the comparison value is a previously computed projected steady state condition value. The comparator may, for example, be a comparator circuit or a software comparison routine loaded on the processor. Preferably, a comparison result value reflecting the relationship between the compared values is generated by the comparator.

In the preferred embodiment, a threshold value is next retrieved from storage. The threshold is preferably a specific value which establishes a clear basis for accepting or rejecting the projected steady state condition value. The comparison result value is compared by the comparator with the threshold value and another comparison result value generated. The projected steady state value is either accepted or rejected based upon the results generated from this last comparison. The results of this comparison can, as appropriate, be displayed, for example graphically, with or without previously projected steady state values, or may be otherwise communicated via the processor. Based upon these results, a signal may be generated and sent, for example over a LAN, to terminate further testing or operation of the product once an acceptable projection has been obtained.

According to another aspect of the invention for products with cyclic transient data, a state value set comprised of a plurality of state values corresponding to the transient data at a plurality of discrete times within more than one cycle of the transient data can be retrieved from the stored transient data by the processor. Using the state value set the processor then computes a rate-of-change value set corresponding to the state value set. This rate-of-change in the state value set is used by the processor to determine a discrete time having a state value with a corresponding rate-of-change which is monotonically varying.

It may also be desirable, in the case of cyclic transient data, for the system processor to retrieve a state value set comprised of a plurality of state values corresponding to the transient data at a plurality of discrete times within a full cycle of the transient data. This value set can be used by the processor to compute a corresponding projected cyclic steady state condition value set by applying each state value within the state value set to the projected steady state conditions function. Because of the cyclic nature of the transient data, the projected steady state condition value set will have a maximum and minimum projected steady state condition value. The maximum and minimum projected values are preferably compared in a comparator with maximum and minimum comparison values. The two resulting comparison result values represent the respective correspondence between the maximum projected value and the maximum comparison value and between the minimum projected value and the minimum comparison value. The processor then retrieves a threshold value from storage. The comparator then compares the threshold value with the two comparison result values and generates a further comparison result value representing the correspondence between the comparison result values and the threshold value.

The system of the present invention can also include a means for determining if the transient data is monotonic or cyclic in nature. The system processor may also be used to generate and communicate a signal which terminates the testing or operation of the product when the threshold value comparison results are deemed acceptable.

It will be understood by the skilled artisan that other features and limitations which have been described in the context of the method of the present invention can also, if desired, be incorporated into the system of the present invention using well known techniques.

DESCRIPTION OF PREFERRED EMBODIMENT

In accordance with the present invention, the Steady state conditions of a product subject to a constant or cyclic set of boundary conditions and evolving in a monotonic manner is projected using a closed-form solution for the projected steady state condition value as a function of a time constant, a property state value and the rate-of-change of the property state value. The time constant is computed using the rate-of-change of the state of the product at two selected times during the stabilization process. Because of the utilization of the closed form solution in determining the projected steady state condition value, substantially improved projections of the steady state conditions can be obtained in a shorter time period.

Figure 1:
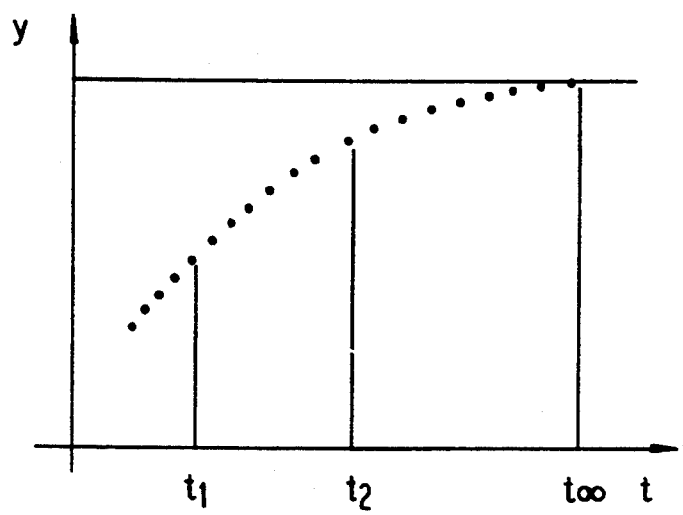
FIG. 1 illustrates the monotonic property state of a product as a function of time.
Figure 8:
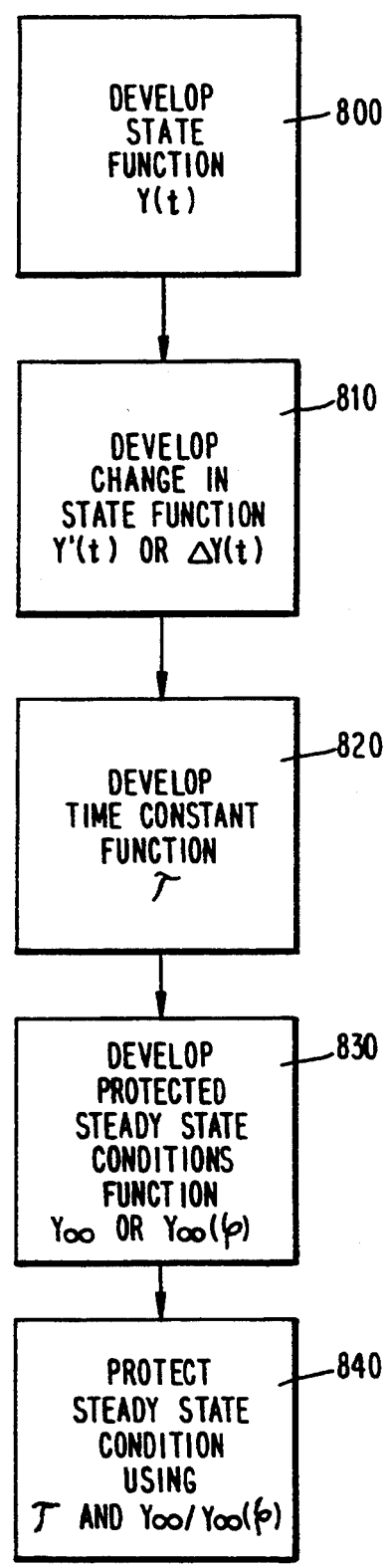
FIG. 8 is a flow chart illustrating the steps to derive the time constant and projected steady state conditions functions used in projecting the steady state condition in accordance with the present invention.

Referring now to FIGS. 1 and 8. FIG. 1 depicts the monotonic property state conditions y(t) as a function of time for a product during, for example, environmental or operational testing. The state function y(t) can be expressed by the following equation:

$$y(t) = A + B^*(1 - e^{-(t-t_0)/\tau}) \quad (1)$$

where $\tau$ is the time constant, $t_0$ is an initial reference time and A and B are constants.

Figure 2:
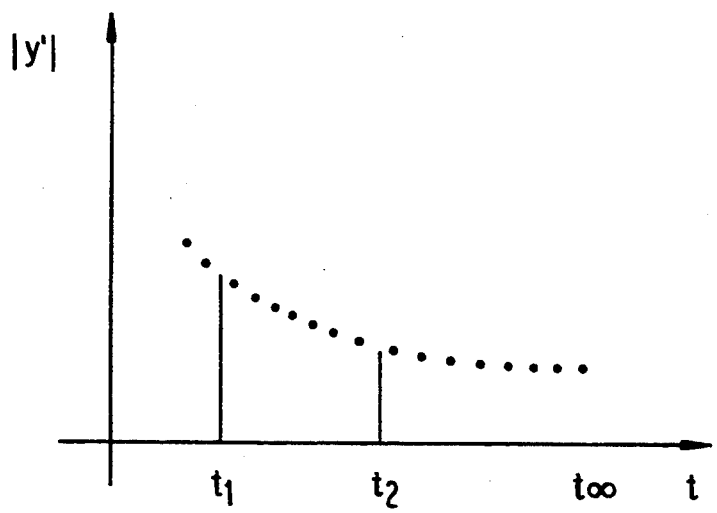
FIG. 2 illustrates the instantaneous rate-of-change in the property states illustrated in FIG. 1, as a function of time.

The instantaneous rate-of-change in the state of the product is represented by the slope of each point along the curve defined in FIG. 1 and is shown in FIG. 2. The instantaneous rate-of-change in the state is derived as follows:

$$y'(t) = (B/\tau)^* e^{-(t-t_0)/\tau} \quad (2)$$

Combining these equation for selected times $t_1$ and $t_2$ allows the time constant to be expressed in terms of known variables as follows:

$$\tau = (t_2 - t_1)/\ln(y'(t_1)/y'(t_2)) \quad (3)$$

The asymptotic value, which is necessarily later in time than $t_2$, can be determined as follows:

$$y_\infty = y(t) + B^* e^{-(t-t_0)/\tau} \quad (4)$$

The constant B can now be eliminated from Equation 4 using Equation 2 so that the asymptotic value can be expressed as follows:

$$y_\infty = y(t) + \tau^* y'(t) \quad (5a)$$

or in particular for the selected time $t_2$:

$$y_\infty = y(t_2) + \tau^* y'(t_2) \quad (5b)$$

Thus, the projected steady state condition value is defined by a closed-form equation, preferably evaluated at the later selected time, $t_2$, while the time constant value is estimated using the rate-of-change in the state value which is derived from the test data at times $t_1$ and $t_2$. Accordingly, as shown in FIG. 8, a state function y(t) representing the transient data as a function of time and a change-in-state function y'(t) or $\Delta y(t)$ representing changes in the transient data as a function of time are developed respectively in steps 800 and 810. A time constant function $\tau$ expressed in terms of at least the change-in-state function is then developed in step 820. The projected steady state conditions function $y_\infty$ expressed in terms of the state function y(t), the change-in-state function y'(t) and the time constant function is next developed in step 830. The steady state condition is now projected in step 840 using the time constant function $\tau$ and the projected steady state conditions function $y_\infty$.

For products having monotonic transient data, the change-in-state function y'(t) is preferably developed in step 810 by taking the first derivative of the state function y(t). The projected steady state conditions function $y_\infty$ is preferably derived by integrating the change-in-state function y'(t) over a time period beginning at a discrete time, say $t_1$, within the above mentioned test or operational period and ending at a discrete time, say $\infty$, corresponding to the time at which a steady state condition will occur.

Figure 3:
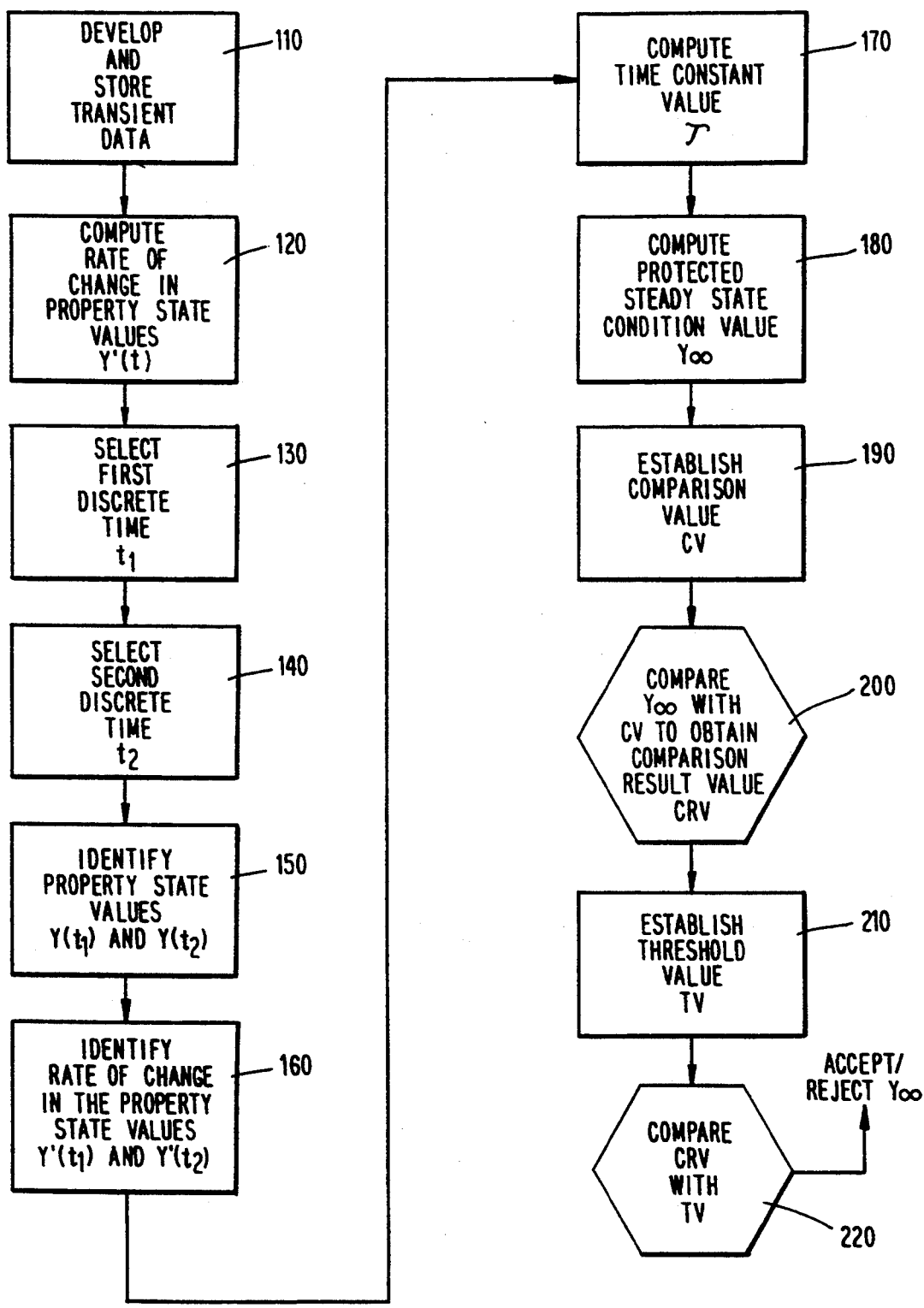
FIG. 3 is a flow chart illustrating the steps to project the steady state condition of a product subject to constant boundary conditions in accordance with the present invention.

FIG. 3 describes the method of the present invention using the foregoing derivations for projecting steady state conditions where the transient data is monotonic. In step 110, the transient data at particular times is developed, for example during product testing, and stored. A determination can be made as to whether the transient data is monotonic or cyclic in nature at this point. However, this is normally known from the test conditions to which the product is being subjected and therefore no separate determination is required. The rate-of-change in the state values which have been stored as transient data are preferably computed using a least squares fit or averaging technique in step 120.

A starting time t is chosen in step 130 such that the rate-of-change in the state value at, as well as those after, t are monotonically varying. A time $t_2$ occurring subsequent to $t_1$ is selected in step 140. Time $t_2$ is preferably selected to correspond with the time for which the most recent transient data is available. The property state values corresponding to selected times $t_1$ and $t_2$ are identified from the previously stored transient data in step 150. In step 160, the corresponding rate-of-change values are selected for the identified state values from the values computed in step 120. In step 170, the rate-of-change in the state values y'($t_1$) and y'($t_2$) are used to compute the time constant Y using the equation derived above. Next, in step 180, an estimated asymptotic value $y_\infty$, i.e., the projected steady state condition value, is calculated utilizing the above derived equation and the state and rate-of-change in the state values corresponding to $t_2$ and the time constant value. The estimated asymptotic value $y_\infty$ computed in step 180 is now compared in step 200 with the most recent previously computed projected steady state value or values which is/are established as the comparison value (CV) in step 190. This comparison results in a comparison result value (CRV).

A threshold value (TV) is established in step 210. The TV can be defined based upon the accuracy requirement for the product under study. When the comparison result value (CRV) of step 200 is determined in step 220 to fall within the threshold, the computed projected steady state condition value is considered to be satisfactory. If the results are unsatisfactory, further transient data is developed and used to again perform steps 110–220. This continues until satisfactory results are obtained.

Figure 4:
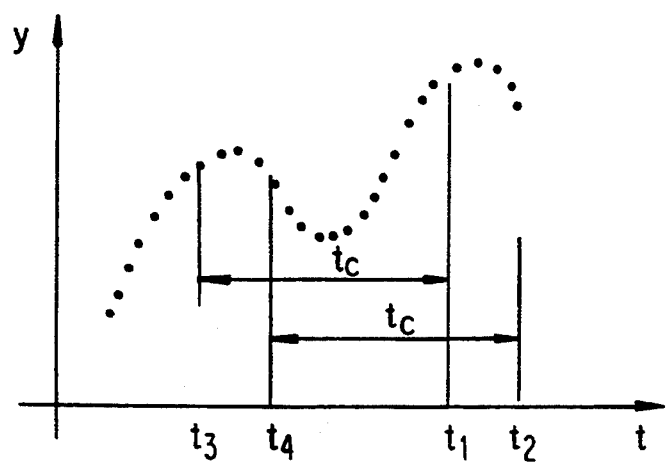
FIG. 4 illustrates the cyclic property state of a product as a function of time.

FIG. 4 depicts the state of a product for cyclic transient data over the time period t which may be represented by the cyclic state function y(t) expressed as follows:

$$y(t) = A + B^*(1 - e^{-(t-t_0)/\tau}) + f(t) \quad (6)$$

where $\tau$ is the time constant, $t_0$ is an initial reference time, which is usually associated with the start of testing, A and B are constants and f(t) is a cyclic function of period $t_c$. The cyclic function f(t) is defined as:

$$f(t) = f(t - t_c) \quad (7)$$

The rate-of-change in the state of the product at selected times t can be derived as follows:

$$\Delta y(t) = y(t) - y(t - t_c) \quad (8a)$$

$$\Delta y(t) = Be^{-\frac{t-t_0}{\tau}}(e^{t_c/\tau} - 1) \quad (8b)$$

Figure 5:
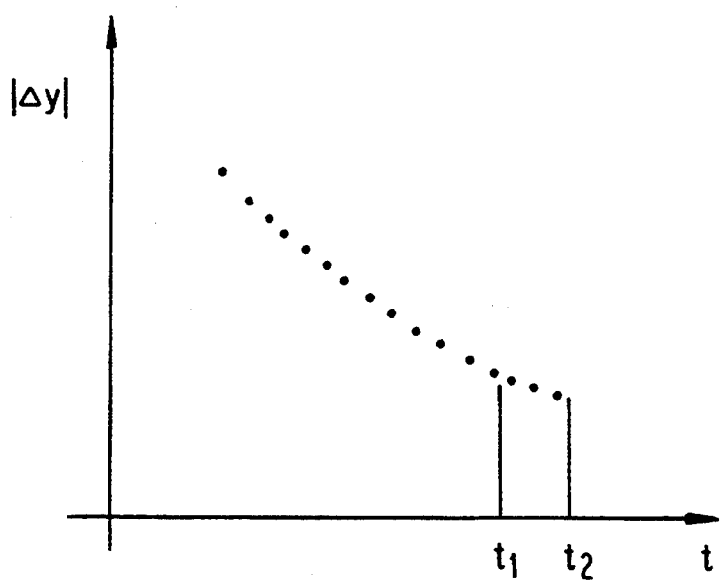
FIG. 5 illustrates the rate-of-change, over a cycle period, in the property states illustrated in FIG. 4 as a function of time.

For the particular time $t_2$ of FIG. 4 and 5, equation 8b becomes:

$$\Delta y(t_2) = Be^{-\frac{t_2-t_0}{\tau}}(e^{t_c/\tau} - 1) \quad (9)$$

The rate-of-change in the state of the product associated with the time length of the cyclic period is shown in FIG. 5. The rate-of-change in the state function $\Delta y(t)$ at selected times t and $t_2$ can be defined as follows:

$$\Delta y(t_1) = y(t_1) - y(t_3) \quad (10a)$$

$$\Delta y(t_2) = y(t_2) - y(t_4) \quad (10b)$$

where $t_1 - t_3 = t_2 - t_4 = t_c$

The time constant $\tau$ can be expressed in terms of the rate-of-change in the state function by at times $t_1$ and $t_2$ as follows:

$$\tau = (t_2 - t_1) / \ln(\Delta y(t_1) / \Delta y(t_2)) \quad (11)$$

Because of the cyclic nature of the transient data, the cyclic change-in-state function equation can be made to reflect the period of the change-in-state cycles as follows:

$$y(t_n) - y(t) = B^*(e^{-(t-t_0)/\tau} - e^{-(t_n-t_0)/\tau}) \quad (12)$$

where
$t_n = t + n^* t_c$; and
n is an integer.

As the steady state condition is approached, the number of cycles n will become very large allowing the cyclic change-in-state function to be represented using the state value data at time t as follows:

$$y_\infty(\psi) = y(t) + B^* e^{-(t-t_0)/\tau} \quad (13)$$

when
$n \to \infty$, and
where $\psi$ is the phase location of t at the projected steady state cycle.

The constant B can be eliminated from Equation 13 by using the difference in the change-in-state function $\Delta y(t)$, resulting in the following:

$$y_\infty(\psi) = y(t) + \Delta y(t) / (e^{t_c/\tau} - 1) \quad (14a)$$

or, for the particular case where the rate-of-change value corresponding to the time $t_2$ is to be used for the projection:

$$y_\infty(\psi) = y(t) + \Delta y(t_2)^* e^{(t_2/\tau} - 1) \quad (14b)$$

Thus, preferably, the projected values of the cyclic condition can now be determined using Equation 14b for different times t within a cyclic interval (for example, between times $t_4$ and $t_2$ of FIG. 4). Referring again to FIG. 8, for products with cyclic transient data, the state function y(t) is developed in step 800 for a period of more than one cycle of the transient data. The change-in-state function $\Delta y()$ is then developed in step 810 to represent changes in the transient data from one cycle to another. The projected steady state conditions function $y_\infty(\psi)$ is developed in step 830 with respect to a phase location at time t in the projected steady state cycle.

Figure 6:
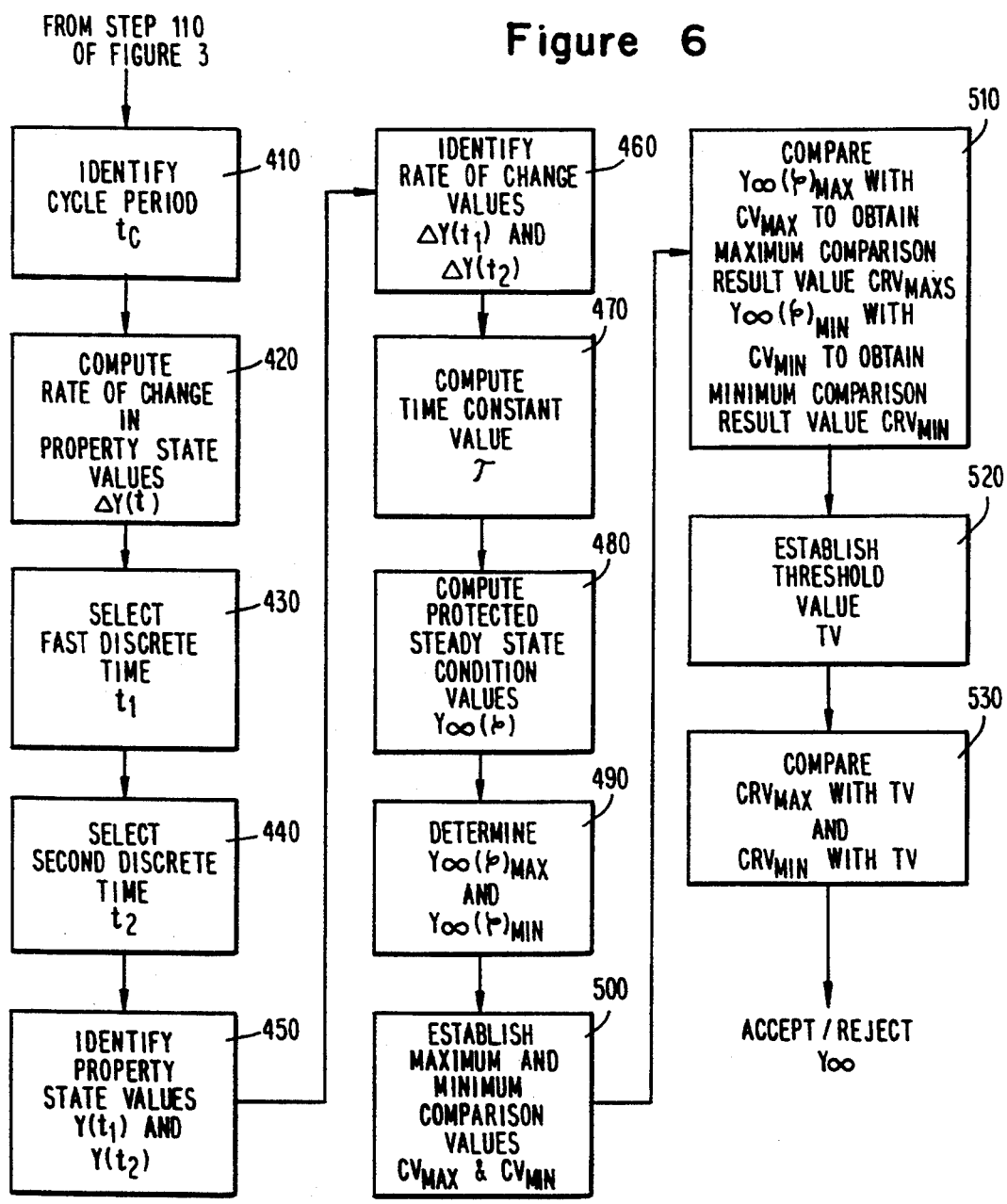
FIG. 6 is a flow chart illustrating the steps to project the cyclic steady state condition of a product in accordance the present invention.

Using these derivations, the steps for projecting the cyclic steady state condition of products will now be described with reference to FIG. 6. The transient data is developed and stored as indicated in step 110 of FIG 3. If desired, a determination could be made to confirm that the transient data is cyclic in nature, however, as noted above, this is not normally required. The cycle period $t_c$ is identified and stored in step 410. The cyclic rate-of-change in the state values, which have been stored as transient data are computed over the cycle period to, by subtracting the state values at particular phases of one cycle from the state values at the same phases of another, preferably immediately subsequent, cycle in step 420.

A starting time $t_1$ is selected in step 430 such that the change-in-state function $\Delta y(t)$ for at and after time $t_1$ is monotonically varying. A time $t_2$ occurring subsequent to $t_1$ is selected in step 440. Time $t_2$ is preferably selected to correspond to the most recent available transient data. The state values corresponding to times $t_1$ and $t_2$ are identified in step 450. The corresponding rate-of-change in the state values at times $t_1$ and $t_2$ are next selected in step 460 from the previously computed rate-of-change values. Using the computed rate-of-change values from step 460 and the function developed above, the time constant $\tau$ can now the computed in step 470. Next, in step 480, the projected value of the cyclic steady state condition can be computed for all times between $t_4$ and $t_2$ for different phases of the cyclic period $t_c$ using the above derived equation along with the applicable state values, the previously determined time constant value $\tau$ and the rate-of-change in the state value at $t_2$. The projected cyclic state condition value is compared and accepted or rejected in the manner described with below.

Preferably, a projected steady state condition value is computed for each time (t) corresponding to a transient data point within the time duration between $t_4$ and $t_2$. Comparisons are then made to determine if the maximum and minimum projected values, for times between $t_4$ and $t_2$, fall within the established threshold. In particular, the maximum and minimum projected steady state condition values within the set of projected values are determined in step 490 and compared in step 510 with comparison values, representing maximum and minimum state values of the product as established in step 500, to obtain comparison results. Preferably, the comparison values are previously computed projected steady state condition values at extreme. These comparison results can be respectively compared in step 530 with a threshold established in step 520 to obtain a threshold comparison result. The threshold comparison result can be used in determining the acceptability of the projected cyclic steady state condition value set.

Figure 7:
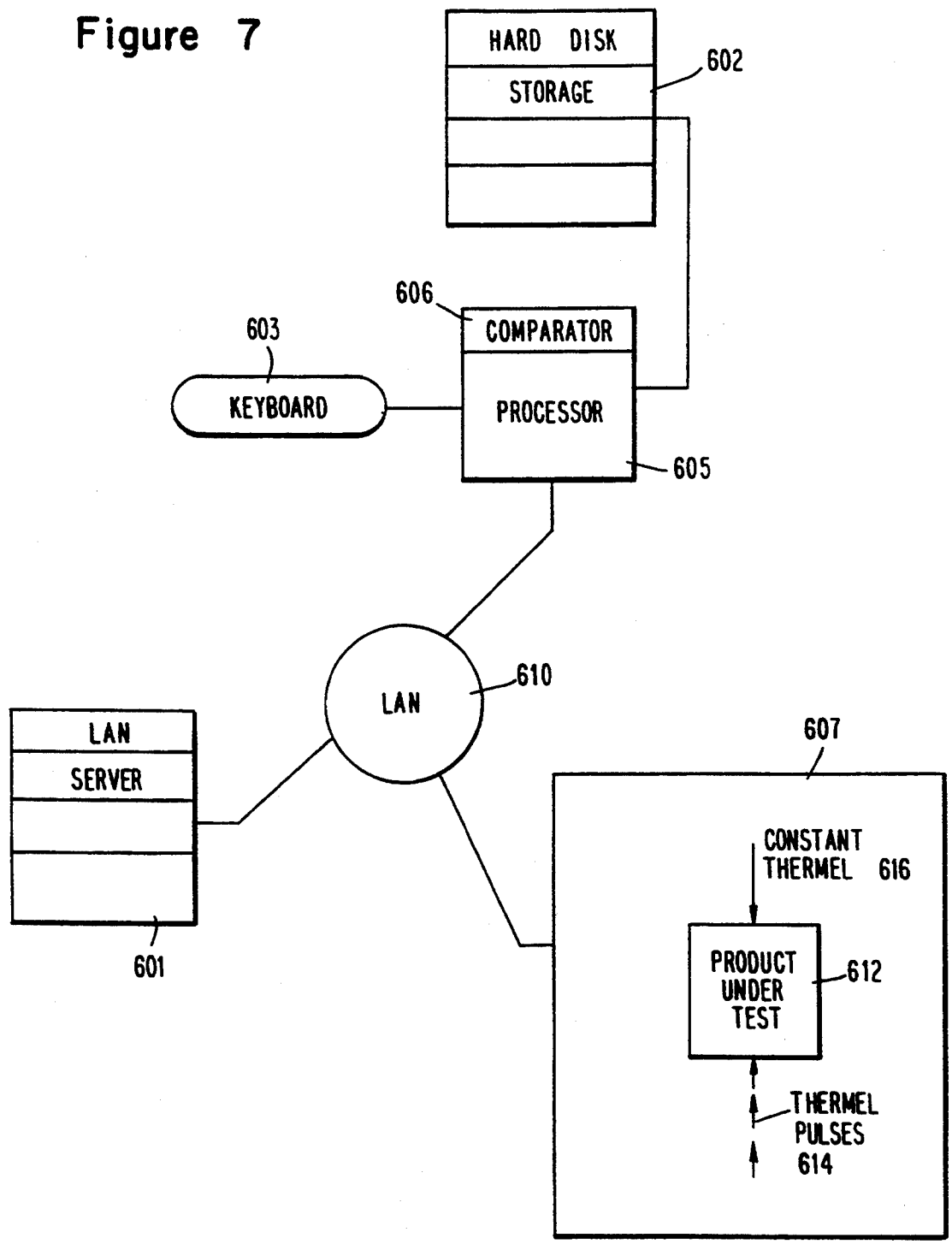
FIG. 7 is a block diagram of a system for projecting the steady state condition of a product having monotonic or cyclic transient data in accordance with the present invention.

The system of the present invention will now be described with reference to FIG. 7. Transient data, representing the property state over particular time duration, of a product 612 subjected to environmental or operational conditions, for example, thermal energy pulses or other varying cyclic input 61.4 or constant thermal energy 616, during physical or simulated operation or testing, is generated in the product test or simulation area 607 and transmitted via local area network (LAN) 610 to LAN server 601. The transient data, including the associate times, is stored on LAN server 601. If desired, the transient data could alternatively be stored on local storage device 602.

Previously developed monotonic and cyclic time constant functions $\tau$, projected steady state conditions functions $y_\infty$ and $y_\infty(\psi)$, and preferably comparison values (CV), threshold values (TV) and time $t_c$, where appropriate, are loaded onto local storage device 602 using keyboard 603. Two discrete times are selected and input to the system using keyboard 603. These times must fall within the time period for which transient data is available. Preferably the later of the selected times corresponds to the time for which the most current transient data is available and the earlier selected time corresponds to a point in time at and after which the rate-of-change in the state data is monotonically varying. The state values for the transient data associated with the selected times are retrieved from server 601 by processor 605 via the LAN 610. The processor 605 may be a personal computer or work station.

The instantaneous or cyclic rate-of-change values corresponding to the retrieved state values are computed by processor 605. The time constant function is next retrieved by processor 605 from local storage device 602 and a time constant value computed by applying the computed rate-of-change values and the time interval to the time constant function. Processor 605 next retrieves the projected steady state conditions function from local storage device 602 and computes a projected steady state condition value by applying the appropriate state value and the rate-of-change value, preferably these values are associated with the later of the selected times, along with the computed time constant value to this function.

The computed projected steady state condition value can now be compared in comparator 606 with the comparison value, preferably a previously computed projected steady state condition value, which is retrieved from local storage 602 by processor 605. A comparison result value representing the correspondence between the comparison value and the projected steady state condition value is generated. A threshold value is similarly retrieved from local storage 602 by processor 605 and input to comparator 606 for comparison with the comparison result value to thereby determine the acceptability of the projected steady state condition value. The comparator may be a comparator circuit or other device capable of performing the required comparisons. The comparator could also be a software routine or program implemented on the processor 605.

In the preferred embodiment, the operator notifies the system via a keyboard input that the transient data is either monotonic or cyclic in nature. However, if desired, the system could include the capability to determine the nature of the transient data. An appropriate processing path is chosen by processor 605 based upon this input or determination. The processor 605 could, if desired, also be provided with the capability of generating, and transmitting over the LAN 610, a termination order to stop further product testing or operation, or a graphic or other report of the results of the comparisons. Other features and limitations described in FIGS. 1–6 can, if desired, be included in the system of the present invention.

As described above, the invention provides an improved method and system for projecting the steady state conditions of a product based upon actual or simulated test or operational data which is either monotonic or cyclic in nature. Utilizing the invention the steady state condition can be accurately projected without the need to wait an inordinate length of time for the product to stabilize through natural damping. Accurate projection of the steady state condition can be performed in less time and hence, at reduced cost than possible using conventional approaches. It will be recognized by those skilled in the art that the particular sequence of the steps described above could be varied and that the system configuration could be modified without deviating from the scope of the present invention.

In the claims:

1. A method for projecting the steady state condition of a product using transient data representing the property state of the product within a time period comprising the steps of:
   selecting a first discrete time within said time period;
   selecting a second discrete time within said time period, wherein said second discrete time is later than said first discrete time;
   identifying a first state value and a second state value respectively corresponding to the transient data at the selected first discrete time and the selected second discrete time;
   computing a first rate-of-change value corresponding to the first state value and a second rate-of-change value corresponding to the second state value;
   computing a time constant value by applying the first and the second rate-of-change values to a time constant function; and
   computing a projected steady state condition value by applying the time constant value to a projected steady state conditions function.

2. A method for projecting the steady state condition of a product according to claim 1, further comprising the step of determining if the transient data is monotonic or cyclic in nature, wherein said determination is made prior to computing the first and second rate-of-change values.

3. A method for projecting the steady state condition of a product according to claim 1, wherein said second discrete time is a time corresponding to the transient data which is most current.

4. A method for projecting the steady state condition of a product according to claim 1, wherein said first discrete time is selected such that the first rate-of-change value is monotonically varying.

5. A method for projecting the steady state condition of a product according to claim 1, further comprising the steps of:
   establishing a comparison value;
   comparing the projected steady state condition value with said comparison value to obtain a first comparison result representing the correspondence between the projected steady state condition value and the comparison value;
   establishing a comparison threshold;
   comparing the first comparison result and the comparison threshold to obtain a second comparison result representing the correspondence between the first comparison result and the comparison threshold value; and
   accepting the projected steady state condition value of said second comparison result is within a predetermined range.

6. A method for projecting the steady state condition of a product according to claim 5, wherein said transient data results from either actual or simulated testing of the product under defined conditions.

7. A method for projecting the steady state condition of a product according to claim 6, further comprising the step of terminating such testing of the product after the projected steady state condition value has been accepted.

8. A method for projecting the steady state condition of a product according to claim 5, wherein said comparison value is a previously computed projected steady state condition value.

9. A method for projecting the steady state condition of a product according to claim 1, wherein the transient data is monotonic in nature.

10. A method for projecting the steady state condition of a product according to claim 9, wherein said first rate-of-change value is monotonically varying.

11. A method for projecting the steady state condition of a product according to claim 10, wherein the rate-of-change values are computed using either a least-squares fit or averaging technique.

12. A method for projecting the steady state condition of a product according to claim 10, wherein said time constant function is $$\tau = (t_2 - t_1)/ln(y'(t_1)/y'(t_2))$$

where
   $t_1$ is the selected first discrete time,
   $t_2$ is the selected second discrete time, and
   $y'(t_1)$ and $y'(t_2)$ are the computed first and second rate-of-change values.

13. A method for projecting the steady state condition of a product according to claim 12, wherein said projected steady state conditions function is $$y_\infty = y(t_2) + \tau \cdot y'(t_2)$$

where $y(t_2)$ is the second state value.

14. A method for projecting the steady state condition of a product according to claim 1, wherein the transient data is cyclic in nature.

15. A method for projecting the steady state condition of a product according to claim 14, wherein said time period has a duration which exceeds one cycle of the transient data.

16. A method for projecting the steady state condition of a product according to claim 14 wherein said first rate-of-change value is monotonically varying.

17. A method for projecting the steady state condition of a product according to claim 16, wherein
   said first and second discrete times are within a first cycle of the transient data; and
   the first and second rate-of-change values are respectively computed based upon the arithmetic difference between the first state value and a corresponding third state value associated with a second cycle of the transient data and the arithmetic difference between the second state value and a corresponding fourth state value associated with the second cycle of the transient data, wherein the second cycle is prior to the first cycle.

18. A method for projecting the steady state condition of a product according to claim 17, wherein said time constant function is $$\tau = (t_2 - t_1)/ln(\Delta y(t_1)/\Delta y(t_2))$$

where
   $t_1$ is the selected first discrete time,
   $t_2$ is the selected second discrete time, and
   $\Delta y(t_1)$ and $\Delta y(t_2)$ are the computed first and second rate-of-change values.

19. A method for projecting the steady state condition of a product according to claim 18, wherein said projected steady state condition function is $$y_\infty(\psi) = y(t) + \Delta y(t_2) \cdot e^{(t_2-t)/\tau}/(e^{t_c/\tau} - 1)$$

where
   t is a third discrete time at a phase location $\psi$ within said first cycle of the transient data,
   y(t) is the fifth state value corresponding to the transient data at the third discrete time t, and
   $t_c$ is a period of time equal to one cycle of the transient data.

20. A method for projecting the steady state condition of a product using cyclic transient data representing the property state of a product within a time period comprising the steps of:
   identifying a plurality of state values within a cycle of the transient data;
   computing a plurality of rate-of-change values corresponding to said plurality of state values;
   selecting a first discrete time and a second discrete time within said cycle of the transient data;
   computing a time constant value by applying (i) a first rate-of-change value from said plurality of rate-of-change values which corresponds to the first discrete time and (ii) a second rate-of-change value from said plurality of rate-of-change values which corresponds to the second discrete time, to a time constant function; and
   computing a projected steady state condition value set by applying said second rate-of-change value, selected ones of said plurality of state values and said time constant value to a projected steady state conditions function.

21. A method for projecting the steady state condition of a product according to claim 20, wherein said first discrete time is selected such that the first rate-of-change value is monotonically varying.

22. A method for projecting the steady state condition of a product according to claim 20, wherein said time period has a duration which exceeds one cycle of the transient data.

23. A method for projecting the steady state condition of a product according to claim 13, wherein said time constant function is $$\tau = (t_2 - t_1)/ln(\Delta y(t_1)/\Delta y(t_2))$$

where
 $t_1$ is the selected first discrete time,
 $t_2$ is the selected second discrete time, and
 $\Delta y(t_1)$ and $\Delta y(t_2)$ are the first and second rate-of-change values.

24. A method for projecting the steady state condition of a product according to claim 23, wherein said projected steady state condition function is $$y\sqrt(\psi) = y(t) + \Delta y(t_2)*e^{(t_2/\tau}-1)$$

where,
 t is a third discrete time at a phase location $\psi$ within said cycle of transient data,
 y(t) is a third state value from said plurality of state values corresponding to the third discrete time t, and
 $t_c$ is a period of time equal to one cycle of the transient data.

25. A method for projecting the steady state condition of a product according to claim , wherein said third discrete time is a time corresponding to the transient data which is most current.

26. A method for projecting the steady state condition of a product according to claim 20, wherein said projected steady state condition value set has a maximum projected value and minimum projected value, and further comprising the steps of:
 establishing a maximum comparison value and a minimum comparison value;
 comparing the maximum projected value with the maximum comparison value and the minimum projected value with the minimum comparison value to obtain a respective first comparison result and second comparison result;
 establishing a comparison threshold;
 comparing the first comparison result and the second comparison result respectively with the comparison threshold to obtain a third comparison result;
 accepting the projected steady state condition value set if said third comparison result is within a predetermined range.

27. A method for projecting the steady state condition of a product according to claim 26, wherein said maximum and minimum comparison values are previously computed projected steady state condition values.

28. A method for projecting the steady state condition of a product according to claim 26, wherein said transient data results from either actual or simulated testing of the product under defined conditions.

29. A method for projecting the steady state condition of a product according to claim 28, further comprising the step of terminating such testing of the product after the projected steady state condition value has been accepted.

30. A method for projecting the steady state condition of a product using transient data representing the property state of the product within a time period comprising the steps of:
 developing a state function representing said transient data as a function of time;
 developing a change-in-state function representing changes in said transient data as a function of time;
 developing a time constant function expressed in terms of said change-in-state function;
 developing a projected steady state conditions function expressed in terms of said state function, said change-in-state function and said time constant function; and
 using said time constant function and projected steady state conditions function to project the steady state condition of a product.

31. A method for projecting the steady state condition of a product according to claim 30, wherein:
 said transient data is cyclic;
 said time period is equal to more than one cycle of the transient data; and
 the change-in-state function is developed to represent changes in said transient data from a first cycle of said transient data to a second cycle of said transient data, wherein said second cycle occurs after said first cycle.

32. A method for projecting the steady state condition of a product according to claim 30, wherein the step of developing the projected steady state conditions function comprises integrating said change-in-state function over a second time period.

33. A method for projecting the steady state condition of a product according to claim 32, wherein the step of developing the change-in-state function comprises taking the first derivative of the state function.

34. A method for projecting the steady state condition of a product according to claim 30, wherein said time constant function is $$\tau = (t_2 - t_1)/ln(y'(t_1)/y'(t_2))$$

where
 $t_1$ is a selected first discrete time within said time period,
 $t_2$ is a selected second discrete time within said time period, and
 $y'(t_1)$ and $y'(t_2)$ are first and second rate-of-change values respectively corresponding to the transient data at said first and second discrete times.

35. A method for projecting the steady state condition of a product according to claim 34, wherein said projected steady state conditions function is $$y_\infty = y(t) + \tau*y'(t)$$

where
 y(t) is a state value corresponding to the transient data at a third discrete time within said time period, and
 y'(t) is a third rate-of-charge value corresponding to the transient data at said third discrete time.

36. A method for projecting the steady state condition of a product according to claim 30, wherein said time constant function is $$\tau = (t_2 - t_1)/ln(\Delta y(t_1)/\Delta y(t_2))$$

where $t_1$ is a selected first discrete time within said time period, $t_2$ is a selected second discrete time within said time period, and $\Delta y(t_1)$ and $\Delta y(t_2)$ are first and second rate-of-change values respectively corresponding to the transient data at said first and second discrete times.

37. A method for projecting the steady state condition of a product according to claim 36, wherein said projected steady state condition function is $$y_\infty(t) = y(t) + \Delta y(t)/(e^{t_c/\tau} - 1)$$

where t is a third discrete time at a phase location within said cycle of transient data, y(t) is a state value corresponding to the transient data at a third discrete time within said time period, $t_c$ is a period of time equal to one cycle of the transient data, and $\Delta y(t)$ is a third rate-of-change value corresponding to the transient data at said third discrete time.

38. A system for projecting the steady state condition of a product using transient data representing the property state of the product within a time period comprising:

means for storing the transient data, a time constant function and a projected steady state conditions function;

means for inputting a first discrete time and a second discrete time, wherein said first and second discrete times are within said time period;

means for retrieving from said storing means a first state value corresponding to the transient data at the first discrete time and a second state value corresponding to the transient data at the second discrete time;

means for computing a first rate-of-change value corresponding to said first state value and a second rate-of-change value corresponding to said second state value;

means for retrieving said time constant function and said projected steady state conditions function from said storing means;

means for computing a time constant value by applying the first and second rate-of-change values to the time constant function; and means for computing a projected steady state condition value by applying the time constant value to the projected steady state conditions function.

39. A system for projecting the steady state condition of a product according to claim 38, wherein said selected second discrete time corresponds to the transient data which is most current.

40. A system for projecting the steady state condition of a product according to claim 38, wherein said first discrete time is selected such that said first rate-of-change value is monotonically varying.

41. A system for projecting the steady state condition of a product according to claim 38, wherein the transient data is monotonic in nature.

42. A system for projecting the steady state condition of a product according to claim 41, wherein said first rate-of-change value is monotonically varying.

43. A system for projecting the steady state condition of a product according to claim 42, wherein the rate-of-change values are computed using a least-squares fit or averaging technique.

44. A system for projecting the steady state condition of a product according to claim 42, wherein said time constant function is $$\tau = (t_2 - t_1)/ln(y'(t_1)/y'(t_2))$$

where $t_1$ is the selected first discrete time, $t_2$ is the selected second discrete time, and $y'(t_1)$ and $y'(t_2)$ are the computed first and second rate-of-change values.

45. A system for projecting the steady state condition of a product according to claim 44, wherein said projected steady state conditions function is $$y_\infty = y(t_2) + \tau^* y'(t_2)$$

where $y(t_2)$ is the second state value.

46. A system in accordance with claim 38, further comprising:

means for storing a comparison value and a threshold value;

means for retrieving said comparison value and threshold value from said storing means;

means for comparing the projected steady state condition value with the comparison value and for generating a first comparison result value representing the correspondence between the projected steady state condition value and said comparison value; and means for comparing the first comparison result value with the threshold value and for generating a second comparison result value representing the correspondence between said first comparison result value and said threshold value.

47. A system for projecting the steady state condition of a product according to claim 46, wherein said comparison value is a previously computed projected steady state condition value.

48. A system for projecting the steady state condition of a product according to claim 46, further comprising means for determining if the transient data is monotonic or cyclic in nature, wherein said determination is made prior to computing the first and second rate-of-change values.

49. A system for projecting the steady state condition of a product according to claim 46, further comprising means for generating a signal to communicate the second comparison result value.

50. A system for projecting the steady state condition of a product according to claim 46, wherein said transient data results from either actual or simulated testing of the product under defined conditions.

51. A system for projecting the steady state condition of a product according to claim 50, further comprising means for generating a signal which terminates said testing when said second comparison result value is acceptable.

52. A system for projecting the steady state condition of a product according to claim 38, wherein the transient data is cyclic in nature.

53. A system for projecting the steady state condition of a product according to claim 52, wherein said first rate-of-change value is monotonically varying.

54. A system for projecting the steady state condition of a product according to claim 53, wherein said time period has a duration which exceeds one cycle of the transient data and further comprising means for storing and retrieving a cycle period value corresponding to a period of time equal to one cycle of the transient data.

55. A system for projecting the steady state condition of a product according to claim 54, wherein:
said first and second discrete times are within a first cycle of the transient data; and
said means for computing the rate-of-change values respectively computes the arithmetic difference between the first state value and a corresponding third state value associated with a second cycle of the transient data and the arithmetic difference between the second state value and a corresponding fourth state value associated with the second cycle of the transient data, wherein the second cycle is prior to the first cycle.

56. A system for projecting the steady state condition of a product according to claim 55, wherein said time constant function is $$\tau = (t_2 - t_1)/ln(\Delta y(t_1)/\Delta y(t_2))$$

where
$t_1$ is the selected first discrete time,
$t_2$ is the selected second discrete time, and
$\Delta y(t_1)$ and $\Delta y(t_2)$ are the computed first and second rate-of-change values.

57. A system for projecting the steady state condition of a product according to claim 56, wherein said projected steady state condition function is $$y_\infty(\psi) = y(t) + \Delta y(t_2) * e^{(t_c/\tau} - 1)$$

where
t is a third discrete time at a phase location $\psi$ within said first cycle of the transient data,
y(t) is a fifth state value corresponding to the transient data at the third discrete time t, and
$t_c$ is the cycle period value.

58. A system for projecting the steady state condition of a product using cyclic transient data, having a cycle period, representing the property state of a product within a time period comprising:
means for storing the transient data, the cycle period, a time constant function and projected steady state conditions function,
means for retrieving a plurality of state values corresponding to the transient data at a plurality of discrete times within one cycle of the transient data, said time constant function and said steady state conditions function;
means for computing a first plurality of rate-of-change values corresponding to said plurality of state values;
means for selecting a first discrete time and a second discrete time within said plurality of discrete times;
means for computing a time constant value by applying (i) a first rate-of-change value from said plurality of rate-of-change values which corresponds to the first discrete time and (ii) a second rate-of-change value from said plurality of rate-of-change values which corresponds to said second discrete time, to the time constant function; and
means for computing a projected steady state condition value set by applying selected ones of said plurality of state values, said second rate-of-change value, said time constant value and said cycle period to the projected steady state conditions function.

59. A system for projecting the steady state condition of a product according to claim 58, wherein said first discrete time is selected such that said first rate-of-change value is monotonically varying.

60. A system for projecting the steady state condition of a product according to claim 58, wherein said time constant function is $$\tau = (t_2 - t_1)/ln(\Delta y(t_1)/\Delta y(t_2))$$

where
$t_1$ is the selected first discrete time,
$t_2$ is the selected second discrete time,
$\Delta y(t_1)$ and $\Delta y(t_2)$ are the first and second rate-of-change values.

61. A system for projecting the steady state condition of a product according to claim 60, wherein said projected steady state condition function is $$y_\infty(\psi) = y(t) + \Delta y(t_2) * e^{(t_2 - t)/\tau}/(e^{t_c/\tau} - 1)$$

where,
t is a third discrete time at a phase location $\psi$ within said plurality of discrete times,
y(t) is a state value within said plurality of state values corresponding to the third discrete time t, and
$t_c$ is the cycle period.

62. A system for projecting the steady state condition of a product according to claim 61, wherein said selected third discrete time corresponds to the transient data which is within a most current cycle of the transient data.

63. A system for projecting the steady state condition of a product according to claim 58, wherein said projected steady state condition value set has a maximum projected value and a minimum projected value, and further comprising:
means for storing a maximum comparison value and a minimum comparison value and a threshold value;
means for retrieving said maximum and minimum comparison values and said threshold value from said storing means;
means for comparing the maximum projected value with the maximum comparison value and the minimum projected value with the minimum comparison value to obtain a respective first comparison result value and second comparison result value representing the respective correspondence between the compared values; and
means for respectively comparing the first and second comparison result values with the threshold value and for generating a third comparison result value representing the correspondence of either said first comparison result valve or said second comparison result value with said threshold value.

64. A system for projecting the steady state condition of a product according to claim 63, wherein said maximum and minimum comparison values are previously computed projected steady state condition values.

65. A system for projecting the steady state condition of a product according to claim 63, further comprising means for generating a signal to communicate the second comparison result value.

66. A system for projecting the steady state condition of a product according to claim 63, wherein said transient data results from either actual or simulated testing of the product under defined conditions.

67. A system for projecting the steady state condition of a product according to claim 66 further comprising means for generating a signal which terminates said testing when said second comparison result value is acceptable.

* * * * *